United States Patent
Young

(10) Patent No.: US 9,263,379 B2
(45) Date of Patent: Feb. 16, 2016

(54) IC PACKAGE WITH METAL INTERCONNECT STRUCTURE IMPLEMENTED BETWEEN METAL LAYERS OF DIE AND INTERPOSER

(71) Applicant: Freescale Semiconductor, Inc., Austin, TX (US)

(72) Inventor: Brian Young, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 163 days.

(21) Appl. No.: 14/144,919

(22) Filed: Dec. 31, 2013

(65) Prior Publication Data

US 2015/0187690 A1    Jul. 2, 2015

(51) Int. Cl.
| | |
|---|---|
| H01L 23/48 | (2006.01) |
| H01L 23/498 | (2006.01) |
| H01L 23/00 | (2006.01) |
| H01L 21/66 | (2006.01) |
| H01L 21/48 | (2006.01) |
| H01L 21/768 | (2006.01) |
| H01L 23/522 | (2006.01) |

(52) U.S. Cl.
CPC ........ *H01L 23/49827* (2013.01); *H01L 21/486* (2013.01); *H01L 21/768* (2013.01); *H01L 22/14* (2013.01); *H01L 24/17* (2013.01); *H01L 24/81* (2013.01); *H01L 23/522* (2013.01); *H01L 2224/16113* (2013.01); *H01L 2224/16225* (2013.01); *H01L 2224/16227* (2013.01); *H01L 2224/1713* (2013.01); *H01L 2224/17177* (2013.01); *H01L 2224/17179* (2013.01); *H01L 2224/81801* (2013.01)

(58) Field of Classification Search
CPC ................ H01L 23/3114; H01L 24/01; H01L 23/49805
USPC ....................................................... 257/778
See application file for complete search history.

(56) References Cited

U.S. PATENT DOCUMENTS

| | | | |
|---|---|---|---|
| 6,163,075 A | 12/2000 | Okushima | |
| 7,193,239 B2 | 3/2007 | Leedy | |
| 8,253,234 B2 | 8/2012 | Barowski et al. | |
| 8,344,512 B2 | 1/2013 | Knickerbocker | |
| 8,405,998 B2 | 3/2013 | Barowski et al. | |

*Primary Examiner* — Elias M Ullah

(57) ABSTRACT

An integrated circuit package includes a die having a first substrate implementing an integrated circuit comprising circuit elements. The die includes a first plurality of metal layers implementing a first portion of a metal interconnect structure for the integrated circuit. The die also includes a first plurality of pads at or overlying a top metal layer of the first plurality of metal layers. The integrated circuit package includes an interposer having a second plurality of metal layers implementing a second portion of the metal interconnect structure. The interposer includes a second plurality of pads at or overlying a top metal layer of the second plurality of metal layers. A plurality of solder structures couple the first and second pluralities of pads. The first and second portions of the metal interconnect structure together complete a signal path between two or more circuit blocks of the integrated circuit.

20 Claims, 6 Drawing Sheets

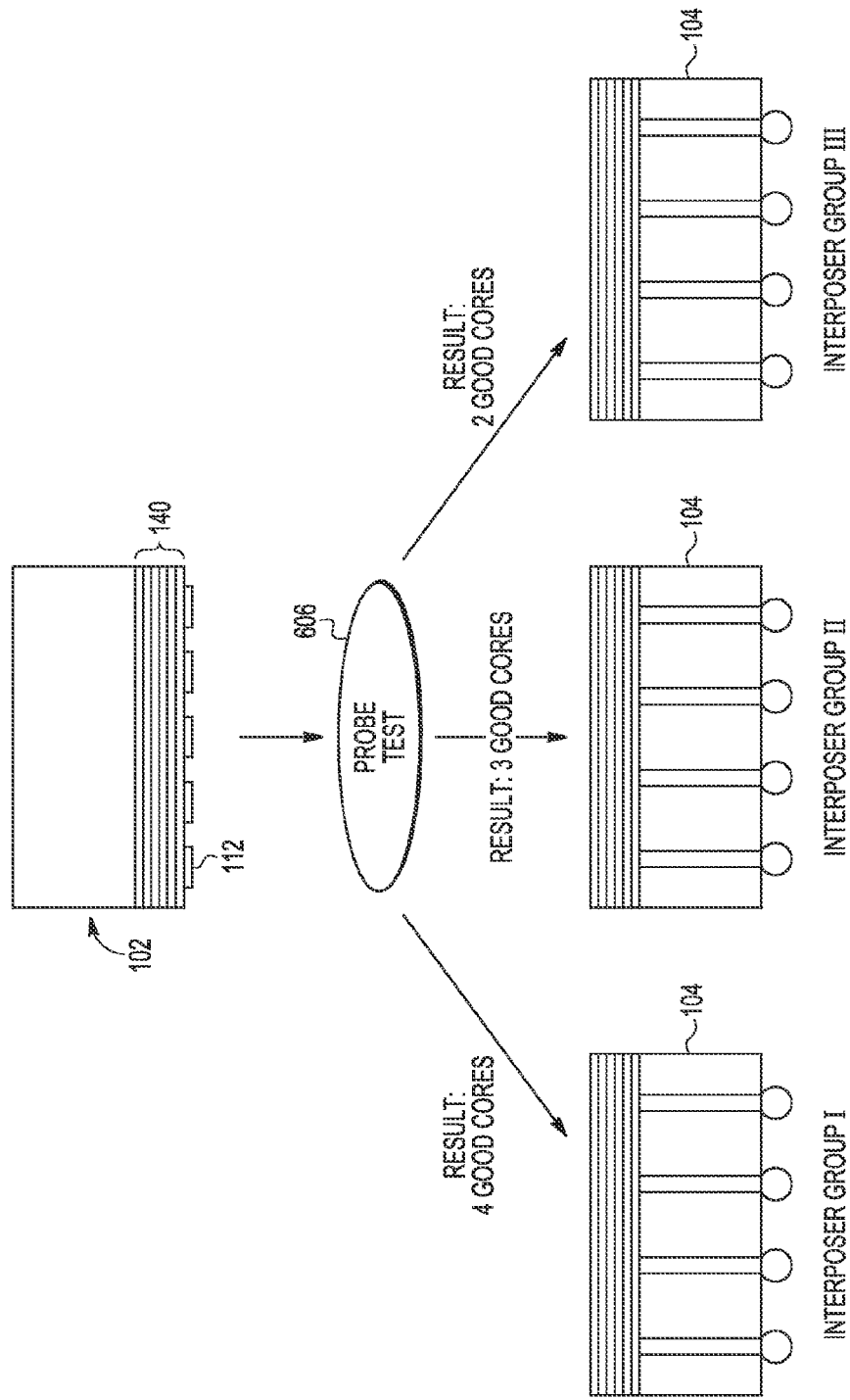

IC PACKAGE WITH METAL INTERCONNECT STRUCTURE IMPLEMENTED BETWEEN METAL LAYERS OF DIE AND INTERPOSER

BACKGROUND

1. Field of the Disclosure

The present disclosure relates generally to integrated circuit (IC) fabrication and packaging.

2. Description of the Related Art

Conventionally, integrated circuit fabrication involves back-end-of-line (BEOL) processing in which the active elements and other circuit components formed at the active surface of a die substrate are interconnected (or "wired") via a metal interconnect structure formed at a plurality of metal layers overlying the active surface of the die substrate. The resulting die typically is then tested through probing of pads formed at or above the top metal layer. However, because of the coarser pitch of the pads and other features at the top metal layers, the probe testing often is limited in its scope.

The probe testing of a die may reveal that one or more components of the die are inoperative (that is, either fully non-operational or operating outside of acceptable parameters). In some instances, such die are discarded. However, in other instances, the die can be binned as a lower-performance part by de-powering the inoperative component. Typically, the component is de-powered using on-die power switching circuits that re-route supply voltages from the component. This de-powering approach also is frequently taken to provide multiple versions of a product from the same design, whereby the feature set of a particular version may be implemented by de-powering circuitry not used in the feature set for the version. However, the on-die power switching circuits conventionally used to provide de-power options typically are also present in the power supply paths of the functioning circuitry. As these power switching circuits consume power and reduce the operating voltage supplied to the functioning circuitry, they can degrade the performance of the functioning circuitry and reduce the overall power efficiency of the IC device implementing the die.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 6 illustrates a process for testing and binning a die having a partial metal stack in accordance with at least one embodiment of the present disclosure.

DETAILED DESCRIPTION

Figure 1:
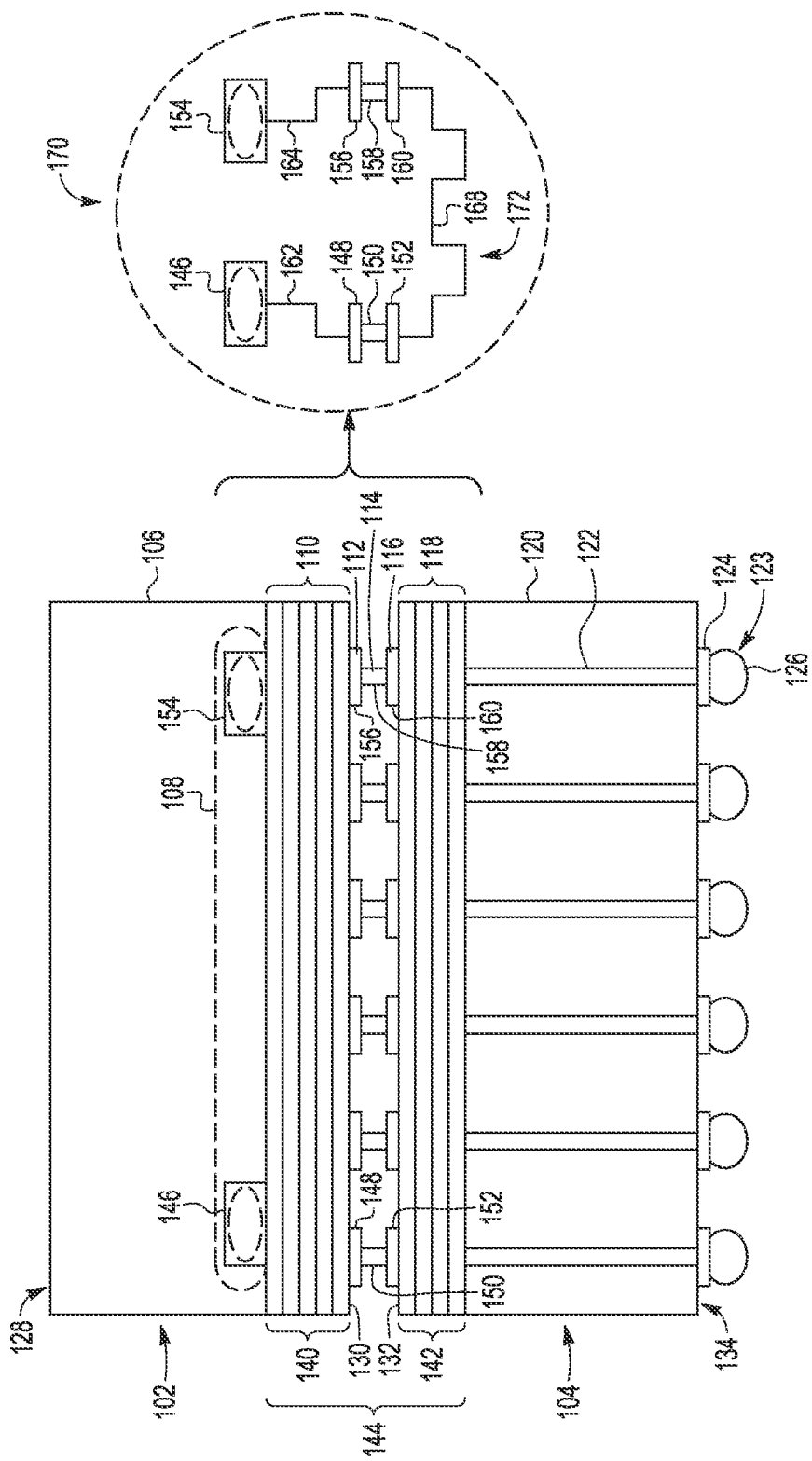
FIG. 1 is a cross-section view of an integrated circuit package comprising a bonded die and interposer that together implement a metal interconnect structure for the circuitry of the die in accordance with at least one embodiment of the present disclosure.

FIGS. 1-6 illustrate example techniques for fabricating an integrated circuit package in a manner that divides the metal interconnect structure for wiring the circuitry of a die, containing multiple circuit blocks, between a first plurality of metal layers of the die and a second plurality of metal layers of an interposer. A first portion of the metal interconnect structure is formed in the metal layers of the die, and the remaining second portion of the metal interconnect structure is formed in the metal layers of the interposer. The top metal layer of the die is bonded to the top metal layer of the interposer, thereby electrically and mechanically connecting the first portion and second portion of the metal interconnect structure so as to form the completed metal interconnect structure. In at least one embodiment, the completed metal interconnect structure completes one or more signaling paths between circuit blocks of the die that were incomplete in the first portion of the metal interconnect structure. That is, in some embodiments, signaling paths between two or more circuit blocks of the die are completed upon the bonding of the interposer and the die. Bonding of the die and interposer can be performed, for example, by coupling a set of pads located on a surface of the die to a corresponding set of pads located on a surface of the interposer using solder microbumps or other solder structures. Under this approach, the top metal surface of the partial metal stack of the die may have a finer pitch than the top metal layer of a conventional die implementing the full metal stack, and thus may permit more fine-grained or extensive probe testing. Moreover, more metal layers can be added than on a conventional die because the interposer typically does not include active elements and because the interposer can implement the coarser higher-levels of wiring of the metal interconnect structure, and thus the yield hit typically wilt occur at the interposer.

In some embodiments, the die may continue to be useable or saleable even though one or more of its components is inoperative. For example, the die may comprise a processor designed with four processor cores, but in the event that one of the processor cores is identified as inoperative, the die may be sold or used as a three-core processor. Similarly, multiple versions of the die may be planned for production, with each version implementing a different feature set, whereby some circuitry that is functional for one feature set may be intended to be non-functional in another feature set. To illustrate, the IC design of the die may provide for two memory interfaces. One version of the design may provide two functional memory interfaces, whereas another version of the IC design may provide one functional memory interface, and thus requiring the disabling of the other memory interface. Thus, the term "operative component," as used herein, refers to a component that is intended to be functional for a corresponding design or version of a design, and is tested or otherwise determined to be functional, and, conversely, the term "inoperative component," as used herein, refers to a component that is either not intended to be functional for a corresponding design or version of a design, or is tested or otherwise determined to be non-functional. As described below, in situations whereby there may be inoperative components in the resulting die, either through design or through fabrication error, various interposers with different partial metal stack configurations that provide different power connection configurations can be produced, and the die can be binned according to its component operational status by selecting and bonding an interposer having a partial metal stack that connects the operative components to the appropriate supply voltages while isolating the inoperative components. This approach of using the partial metal stack of the interposer to de-power the inoperative component of the die can more effectively isolate the inoperative component, and thus more effectively reduces or eliminates parasitic power consumption compared to on-die power switching.

The terms "top" and "bottom" are used herein to reference positioning or placement of certain components relative to the view orientation of the corresponding figure in which they are depicted. The terms "top" and "bottom" as used herein do not necessarily indicate that a "top" component is above a "bottom" component as such directions and/or components may be flipped, rotated, moved in space, placed in a diagonal orientation or position, placed horizontally or vertically, or similarly modified.

FIG. 1 illustrates a cross-section view of an assembled integrated circuit (IC) package 100 in accordance with some embodiments. The IC package 100 typically is configured to be electrically coupled to a printed circuit board (PCB) or other carrier for implementation in an electronic device, which may include, for example, an electronic control system of an automobile or other vehicle, a portable electronic device such as a cellular phone, tablet computer, or notebook computer, a desktop computer, a server, and the like. For the view depicted in FIG. 1, the dimensions of certain features of the IC package, such as solder structures, pads, metal layers, and through-substrate vias, are exaggerated relative to the other features of the die 102 and interposer 104 for purposes of illustration.

In the depicted example, the IC package 100 comprises a die 102 bonded to an interposer 104 ("to" and "bottom" being relative to the orientation of FIG. 1). The die 102 and the interposer 104 comprise one or more substrates 106, 120, respectively, upon which semiconductor IC devices or microelectromechanical systems (MEMS) are formed during a back-end-of-line (BEOL) process. The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like.

The die 102 comprises two opposing major surfaces, labeled top surface 128 and bottom surface 130. The die 102 includes a substrate layer 106 implementing an integrated circuit 108 comprising multiple circuit blocks, such as circuit blocks 146 and 154, at an active surface. The circuit blocks of the integrated circuit 108 implement active circuit elements and other circuit elements, such as integrated resistors, capacitors, and the like (not shown). The die 102 further comprises a plurality of metal layers 110 formed above the active surface of the substrate layer 106 and extending to the bottom surface 130, wherein the plurality of metal layers 110 implement a first portion 140 of a metal interconnect structure 144 for wiring the circuit elements of the integrated circuit 108 (the first portion 140 also referred to herein as "partial metal stack 140"). The metal layers 110 may be formed from any of a variety or combination of conductive materials, such as Copper (Cu), Aluminum (Al), Gold (Au), Nickel (Ni), etc. In the illustrated embodiment, a plurality of microbump pads 112 are formed at, or over, the top metal layer of the die 102.

The interposer 104 likewise comprises two opposing major surfaces, labeled top surface 132 and bottom surface 134. The interposer 104 includes a substrate 120 and a plurality of metal layers 118 formed thereon. The plurality of metal layers 118 of the interposer 104 implement a second portion 142 of the metal interconnect structure 144 (the second portion 142 also referred to herein as "partial metal stack 142"). In the illustrated embodiment, a plurality of pads 116 are formed at, or over, the top metal layer of the interposer 104. The interposer 104 also contains a plurality of through-substrate vias 122 or other through holes that extend through the substrate 120 from the bottom surface 134 of the interposer 104 to the second plurality of metal layers 118. The through-substrate vias 122 are coupled to a plurality of package leads 123 formed at the bottom surface 134 of the interposer 104. In the depicted example, these package leads 123 are implemented as a plurality of bumps 126 formed on corresponding pads 124. In other embodiments, these package leads 123 can comprise, for example, pins, columns, pads, balls, and the like. A subset of the through-substrate vias 122, coupled to the package leads 123, are used to convey supply voltages from an external source (e.g., a PCB or substrate upon which the IC package 100 is mounted), such as one or more Vdd voltages and a ground voltage reference, and digital or analog signaling to and from the IC package 100.

In an alternate embodiment, rather than using through-substrate vias 122 to couple the package leads 123 to the die 102 and the interposer 104, the package leads 123 can be coupled via wirebonding, whereby the metal layers 118 may be configured to carry signaling and power interconnects out to wirebond pads (not shown) at the edge of the interposer 104, which are then connected to the package leads 123 or another leadframe via corresponding wirebond leads. For ease of illustration, example implementations based on through-substrate vias are described herein, but similar techniques may be used for wirebonding-based implementations using the guidelines provided herein.

In the depicted example, the die 102 and the interposer 104 are bonded together by mechanically and electrically coupling the pads 112 of the die 102 to corresponding pads 116 of the interposer 104 via solder structures 114. In at least one embodiment, these solder structures 114 comprise solder microbumps, which may be formed by depositing a solder dot on the surface of the pads of either the die 102 or the interposer 104, aligning and joining the top surface 132 of the interposer 104 and the bottom surface 130 of the die 102, and performing a solder reflow process to form the microbumps from the solder dots. These solder dots may be composed of a variety of materials such, but not limited to: pure tin (Sn), tin (Sn)-copper (Cu), tin (Sn)-bismuth (Bi), tin (Sn)-silver (Ag), tin (Sn)-indium (In), tin (Sn)-silver (Ag)-copper (Cu), and nickel (Ni)-palladium (Pd). For ease of reference, the solder structures 114 are also referred to herein as microbumps 114, but are not limited to a solder microbump implementation.

With the die 102 and interposer 104 bonded as shown in FIG. 1, the first metal stack portion 140 and the partial metal stack 142, along with the microbumps 114 and microbump pads 112 and 116 connecting the two, together form, or complete, the metal interconnect structure 144 that serves as the wiring to interconnect the circuit blocks 146 and 154 of the integrated circuit 108, as well as to connect the integrated circuit 108 to the supply voltages and signaling conducted via the package leads 123 and the through-substrate vias 122, or conducted via the package leads 123 or other leadframe and wirebonds formed at the interposer 104. That is, the partial metal stack 140 of the die 102 forms an initial portion of the wiring (e.g., vias and traces that form interconnects between circuit elements of the integrated circuit 108), and when the die 102 is bonded to the interposer 104, the vias and traces of the final portion of the wiring represented by the metal stack portion 142 of the interposer 104 completes the wiring by forming additional interconnects between the circuit elements of the integrated circuit 108 and by completing the conductive paths between the integrated circuit 108 and the through-substrate vias 122 or wirebond leads (and thus with the package leads 123) for the purposes of conveying signaling and power between an external component (e.g., a PCB) and the integrated circuit 108.

For example, window 170 illustrates the metal structures used to form a signal path 172 between the circuit block 146 and the circuit block 154. The signal path 172 includes metal interconnect path 162 (comprising vias and traces) routing from the circuit block 146 through the partial metal stack 140 of the die 102 to the microbump pad 148 and a metal interconnect path 164 (comprising vias and traces) routing from the circuit block 154 through the partial metal stack 140 to the microbump pad 156. The signal path 172 further includes metal interconnect path 168 (comprising vias and traces) routing from the microbump pad 152 to the microbump pad 160 in the partial metal stack 142 of the interposer 104. Thus, as illustrated, the metal interconnect paths 162 and 164 are not connected within the metal layers of the partial metal stack 140, and thus the signal path 172 is not completed in the die 102 by itself. Rather, when the interposer 104 is bonded to the die 102, the signal path 172 is completed by electrically and mechanically coupling the metal interconnect paths 162, 164, and 168 using the solder microbumps 150 and 158 formed between the pads 148 and 152 and between the pads 156 and 160, respectively. Thus, as illustrated by the example of the signal path 172, the die 102 is formed with some of the wiring of the metal interconnect structure 144, and the interposer 104 is formed with the remainder of the wiring of the metal interconnect structure 144, and the bonding of the die 102 and the interposer 104 completes the wiring of the metal interconnect structure 144.

This approach of dividing the metal interconnect structure 144 between the metal layers of the die 102 and the interposer 104 can address a number of issues present in conventional fabrication processes whereby the entire metal interconnect structure is implemented solely in the metal layers of the die. For example, it becomes increasingly complex and thus expensive for the fabrication of each additional metal layer on a die. As such, conventional die fabrication techniques may limit the number of metal layers to a relatively low number. However, by dividing the metal interconnect structure 144 between the die 102 and the interposer 104, an effectively greater number of metal layers may be implemented for the metal interconnect structure 144, which can reduce yield loss or permit a more complex metal interconnect structure 144 to be fabricated. To illustrate, the first six finer-grained lower metal layers may be formed on the die as metal layers 110, and five coarser-grained metal layers may be formed on the interposer 104 as metal layers 118, and thus the combination of the die 102 and the interposer 104 provides eleven metal layers in which the metal interconnect structure 144 is formed. In contrast, fabrication design rules may limit a die to, for example, a maximum of six metal layers by itself.

Moreover, as the top metal layer in a conventional die is used to form pads for the package leads or for larger solder structures, it is difficult to gain access to certain components of the IC circuitry as the connectivity is relatively limited at the top metal layer. However, by effectively making the top metal layer of the die 102 a middle metal layer of the overall metal interconnect structure 144, more extensive connectivity to the integrated circuit 108 can be provided for probe testing via the top metal layer of the die 102. As such, the die 102 can be more extensively tested before being bonded to the interposer 104.

Additionally, the technique of dividing the metal interconnect structure 144 between the die 102 and the interposer 104 can more effectively de-power, or isolate, inoperative components (e.g., malfunctioning or unused components) in the integrated circuit 108 compared to conventional on-die power switching techniques. If a particular component is identified as inoperative (either through testing or through the feature set intended for the die 102) but the remaining circuitry remains viable and intended for use, the die 102 can be bonded to a version of the interposer 104 having the wiring in its metal layers 118 configured so as to route power away from the inoperative component and away from the wiring in the metal layers 110 of the die 102 that are connected to the inoperative component. As such, the interposer 104 effectively electrically isolates the inoperative component in the die 102 without relying on fuses or on-die power switches. The resulting IC package 100 thus may exhibit lower power consumption compared to conventional de-powering techniques.

Figure 2:
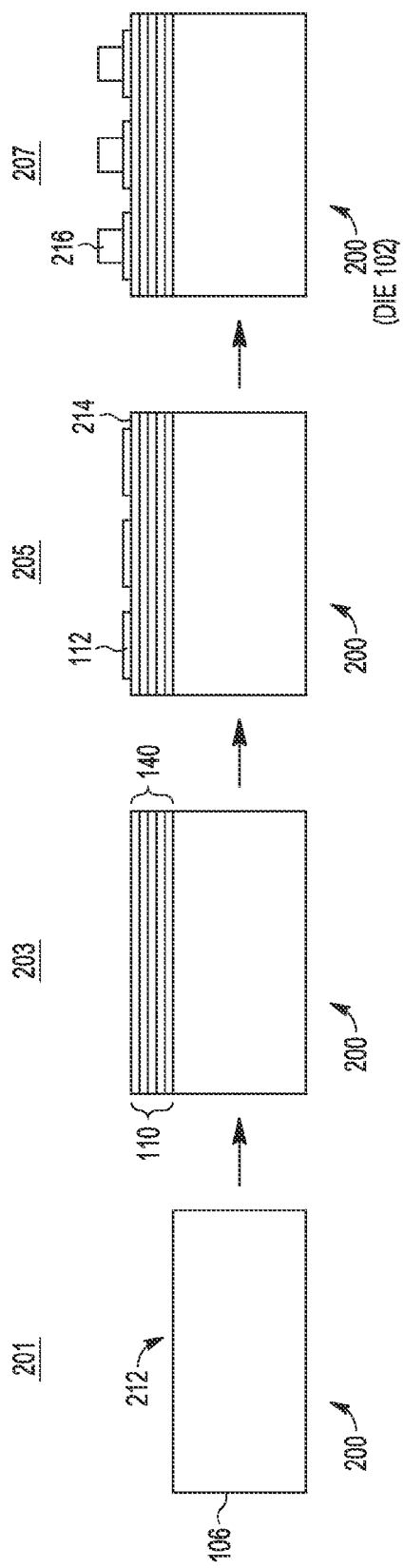
FIG. 2 illustrates an example process of fabricating the die of FIG. 1 in accordance with at least one embodiment of the present disclosure.
Figure 3:
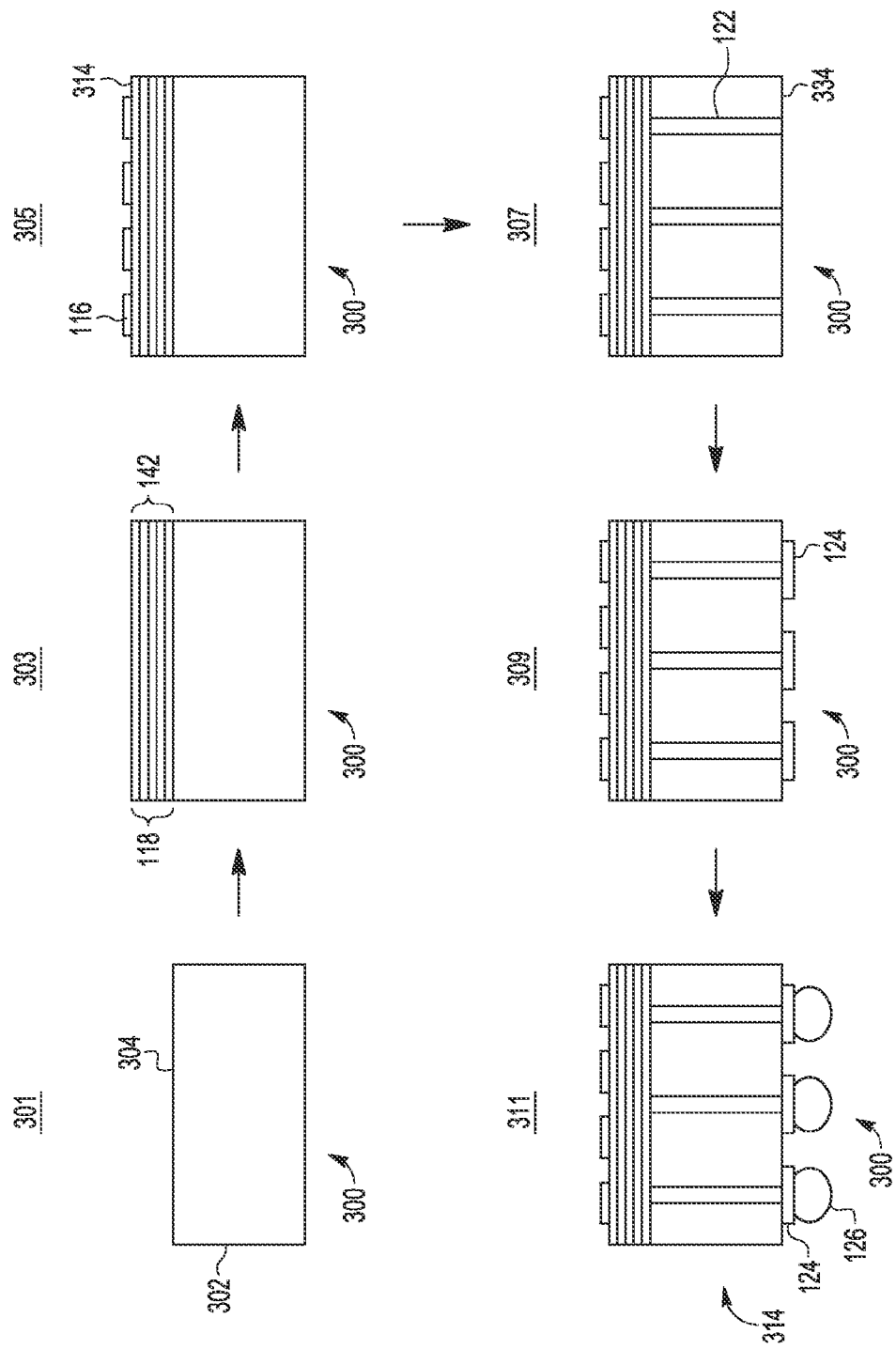
FIG. 3 illustrates an example process of fabricating the interposer of FIG. 1 in accordance with at least one embodiment of the present disclosure.
Figure 4:
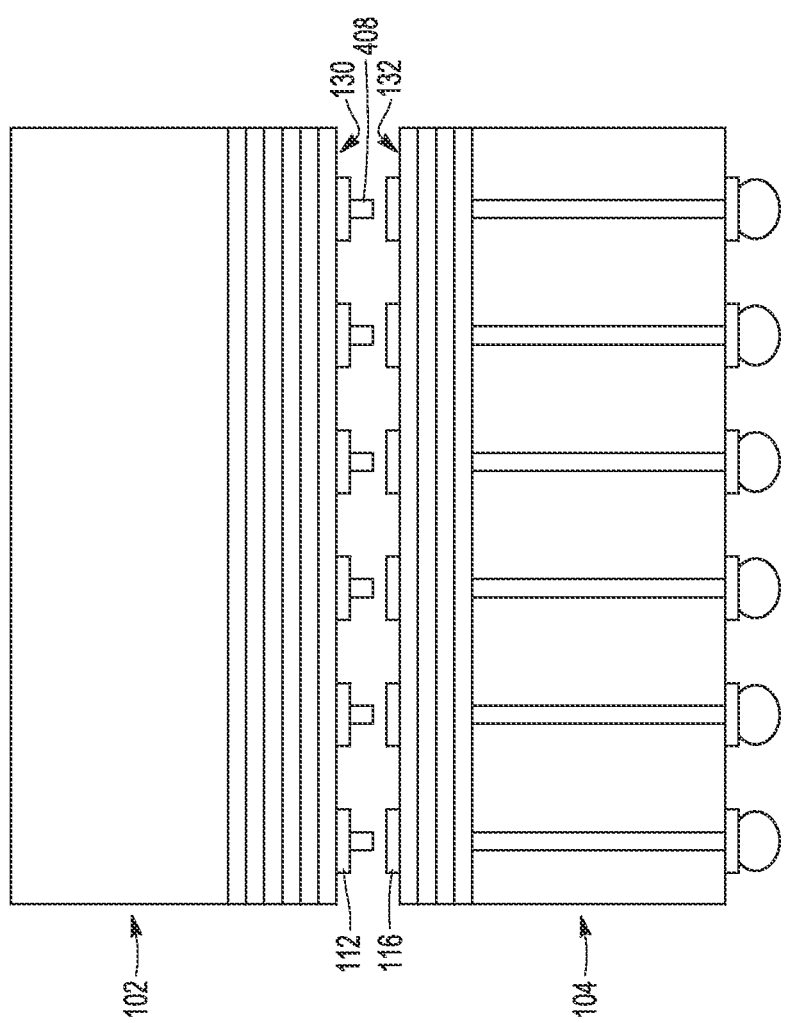
FIG. 4 illustrates an example process of bonding of the die and interposer of FIG. 1 in accordance with at least one embodiment of the present disclosure.

FIGS. 2-4 sequentially illustrate an example process of fabricating the IC package 100 in accordance with at least one embodiment. As with the view depicted in FIG. 1, the dimensions of certain features, such as the microbumps, pads, plurality of metal layers, and through-substrate vias, are exaggerated relative to the other features of the die 102 and interposer 104 for purposes of illustration.

FIG. 2 illustrates a cross-section view of a workpiece 200 as it is processed to ultimately form the die 102 of FIG. 1 in accordance with some embodiments. For ease of illustration, this processing is described primarily with respect to the workpiece 200 as an individual die. However, it will be appreciated that some or all of these described processes may be performed on the workpiece 200 while it is part of a wafer, that is, prior to singulation of the resulting die.

At an initial stage 201, the workpiece 200 is formed by fabricating circuit elements comprising the integrated circuit 108 (FIG. 1) at an active surface 212 of a die substrate 106. At stage 203, the plurality of metal layers 110 is then formed overlying the active surface 212 in order to create the partial metal stack 140. The metal layers 110 thus comprise traces, vias, and other horizontal and vertical conductive features connected to corresponding circuit elements of the integrated circuit 108 at the active surface 212 and that together form a portion of the metal interconnect structure 144 (FIG. 1). At stage 205, the plurality of microbump pads 112 are formed at, or overlying, a top metal layer 214 of the workpiece 200, whereby these microbump pads 112 are electrically connected to corresponding features of the partial metal stack 140. At stage 207, solder dots 216 may be formed on the microbump pads 112, whereby after a solder reflow process these solder dots 216 form the microbumps 114 (FIG. 1) connecting the partial metal stack 140 to the partial metal stack 142 of the interposer 104 (FIG. 1). In other embodiments, these solder dots are formed on the pads 116 of the interposer 104 instead. At this stage, the workpiece 200 may be singulated from a wafer so as to complete fabrication, resulting in formation of the die 107.

FIG. 3 illustrates a cross-section view of a workpiece 300 as it is processed to ultimately form the interposer 104 of FIG. 1 in accordance with some embodiments. For ease of illustration, this processing is described primarily with respect to the workpiece 300 as a singulated substrate. However, it will be appreciated that some or all of these described processes may be performed on the workpiece 300 while it is part of larger substrate or wafer, that is, prior to singulation of the resulting interposer.

At an initial stage 301, the workpiece 300 is formed from a substrate 302, such as a PCB substrate, silicon substrate, or other carrier substrate. At stage 303, the plurality of metal layers 118 is then formed overlying a top surface 304 of the substrate 302 in order to create the partial metal stack 142, whereby the metal layers 118 comprise traces, vias, and other horizontal and vertical conductive features that together form a portion of the metal interconnect structure 144 (FIG. 1). As noted above, in some embodiments, different versions of the interposer 104 may be fabricated so as to provide different wiring configurations within the corresponding version of the metal stack portion 142 of the interposer 104. For example, one version of the interposer 104 may be fabricated such that its metal stack portion 142 provides power and signal connectivity to corresponding conductive features in the partial metal stack 140 of the die 102 that are connected to a particular component of the integrated circuit 108 of the die 102, whereas another version of the interposer 104 may be fabricated such that its metal stack portion 142 isolates these conductive features in the partial metal stack 140 of the die 102, and thus isolating the component of the integrated circuit 108 from power.

At stage 305, the plurality of microbump pads 116 are formed at, or overlying, a top metal layer 314 of the workpiece 300, whereby these microbump pads 116 are electrically connected to corresponding features of the partial metal stack 142. At stage 307, the plurality of through-substrate vias 122 or other through-holes are formed in the substrate 302 of the workpiece 300, wherein the through-substrate vias 122 extend from a bottom surface 334, or backside, of the substrate 302 to the metal layers 118. At stage 309, the plurality of pads 124 are formed at the bottom surface 334, whereby the pads 124 overlie or are otherwise electrically coupled to the through-substrate vias 122. The pads 124 may be formed from any of a variety or combination of materials, such as Aluminum (Al), (Ni), Copper (Cu), Gold (Au), Silver (Ag), (Ag), etc. At stage 311, the plurality of solder structures 126 are formed at the pads 124. Although FIG. 3 illustrates an embodiment whereby the package leads 123 are implemented as solder balls, in other embodiments the package leads 123 may be implemented at the bottom surface 334 as pins, columns, and the like. At this stage, the workpiece 300 may be singulated from a wafer so as to complete fabrication, resulting in formation of the interposer 104.

FIG. 4 illustrates a cross-section view of the die 102 and the interposer 104 during a bonding process so as to form the IC package 100 in accordance with some embodiments. As illustrated, solder dots 408 are formed at either the microbump pads 112 (as illustrated) or the microbump pads 116. The die 102 and the interposer 104 then are manipulated so that the surface 130 of the die 102 faces the surface 132 and the microbump pads 112 of the die 102 are aligned with the microbump pads 116 of the interposer 104. The die 102 and the interposer 104 are then subjected to a solder reflow process so that the solder dots 408 reflow to form the microbumps 114 that electrically and mechanically connect the microbump pads 112 and the pads 116, thus bonding the die 102 and the interposer 104. The bonded die 102 and interposer 104 then may be encapsulated in an encapsulant material to complete the fabrication of the IC package 100.

Figure 5:
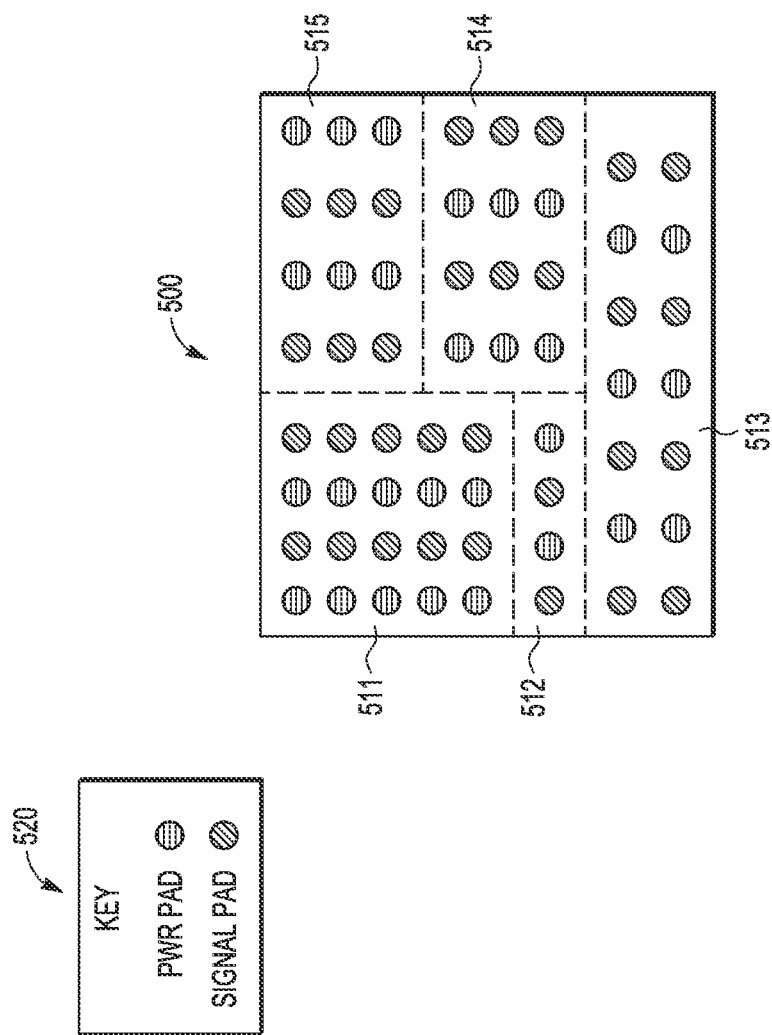
FIG. 5 illustrates a top metal surface of the die of FIG. 1 after fabrication in accordance with at least one embodiment of the present disclosure.

FIGS. 5 and 6 together illustrate a process for probe testing and binning the die 102 so as to select one of a plurality of versions of the interposer 104 suited to the particular operational status of the die 102 determined via probe testing. To this end, FIG. 5 illustrates a simplified plan view of an example top metal layer 500 of the die 102 after formation of the microbump pads 112 on or over the top metal layer 500. In the depicted example, there are sixty-four microbump pads 112 in an 8-by-8 array, with the microbump pads 112 in regions 511, 512, 513, 514, and 515 being connected to components A, B, C, D, and E, respectively, of the integrated circuit 108 (FIG. 1) via corresponding conductive features in the underlying metal layers 110 (FIG. 1) of the die 102. As illustrated by key 520, some of these microbump pads 112 are utilized to convey supply voltages, while others are used to convey signaling.

In this example configuration, a fine-pitch probe can be used to probe test the components A-E through their respective microbump pads 112 so as to determine their operational statuses (e.g., operative or inoperative). Because the probe test has access to a lower metal layer than could be accessed in a conventional die probe test due to the division of the metal layers between the die 102 and the interposer 104, the probe test may more accurately test the individual components than would be possible on a conventional die in which all metal layers for the metal interconnect structure are formed solely at the die.

FIG. 6 illustrates an example die binning process 600 that can utilize this operational status probe testing to select an appropriate version of the interposer 104 based on the operational status of the components of the die 102. In particular, the die binning process 600 described below can be used to select a version of the interposer 104 that serves to isolate an inoperative component from the supply voltages, thereby reducing or eliminating the parasitic power draw that the inoperative component otherwise would incur. Although the die binning process 600 is described in the example context of probe testing to identify components that are not operating as intended, a similar process may be employed for binning the die based on the intended version or intended feature set of the die, and thus reference to an operative component or inoperative component also applies to intended-for-use components, and not-intended-for-use components, respectively.

As illustrated, after fabrication of the die 102, the die 102 is subjected to a probe test 606 via the microbump pads 112 formed at the top metal layer 500 (FIG. 5) to identify the operational status of the die 102, that is, which testable components are operative and which are inoperative (that is, completely non-operative or operating outside of defined specifications). Based on this operational status, a fabrication tool selects a version of the interposer 104 with a conductive feature configuration within its partial metal stack 142 (FIG. 1) that is compatible with the conductive feature configuration of the partial metal stack 140 of the die 102 so as to connect the operational components of the integrated circuit 108 of the die 102 to corresponding signaling and supply voltages, while isolating any inoperative components from at least the power supply voltages. In this manner, a version of the interposer 104 tailored to the particular operational status of the die 102 may be bonded to the die 102 to form a particular version of the metal interconnect structure 144 (FIG. 1) between the partial metal stack 140 of the die 102 and the metal stack portion 142 of the interposer 104 that suitably wires those operational components while electrically isolating the inoperative components.

The following illustrates an example of this binning process. For this example, assume that the IC package 100 comprises a processor designed with four processor cores in the integrated circuit 108 of the die 102. However, as is typical, the yield may vary during fabrication of die 102 according to this design, and thus one or more of the processor cores may be inoperative. As there are four processor cores (processor cores A, B, C, and D), there are sixteen potential operational status scenarios, ranging from all four processor cores being inoperative to all four processor cores being operative. Further in this example, assume that a die 102 with three or more inoperative processor cores is treated as completely defective, in which case the die 102 is discarded. Under these criteria, there are eleven possible non-completely defective possibilities for the die 102, and thus eleven versions of the interposer 104 may be fabricated, each version providing the appropriate power isolation or connectivity in its corresponding version of the partial metal stack 142. These eleven versions may be grouped as, for example, Group I (a single version for all four processor cores being identified as operative), Group II (four versions for three of the four processor cores being identified as operative), and Group III (six versions for two of the four processor cores being identified as operative). Table 1 illustrates an example correspondence between the operational status of the processor cores A, B, C, and D and the corresponding version of the interposer 104 to be selected.

TABLE 1

Interposer Version Selection Based on Operational Status

| Core A Operational? | Core B Operational? | Core C Operational? | Core D Operational? | Interposer Version |
|---|---|---|---|---|
| Yes | Yes | Yes | Yes | 1 (Group I) |
| Yes | Yes | Yes | No | 2 (Group II) |
| Yes | Yes | No | Yes | 3 (Group II) |
| Yes | No | Yes | Yes | 4 (Group II) |
| No | Yes | Yes | Yes | 5 (Group II) |
| Yes | Yes | No | No | 6 (Group III) |
| Yes | No | No | Yes | 7 (Group III) |
| No | No | Yes | Yes | 8 (Group III) |
| Yes | No | Yes | No | 9 (Group III) |
| No | Yes | No | Yes | 10 (Group III) |
| No | Yes | Yes | No | 11 (Group III) |

Thus, as illustrated by Table 1, if the probe test 606 of the die 102 reveals that all four processor cores are operational, the die 102 is binned to Group I, whereby version 1 of the interposer 104 is selected and bonded to the die 102, thereby resulting in a version of the IC package 100 whereby all four processor cores are powered. However, if the probe test 606 of the die 102 reveals that processor cores C and D are inoperative, then the die 102 is binned to Group III, whereby version 6 of the interposer 104 is selected and bonded to the die 102, thereby resulting in a version of the IC package 100 whereby the processor cores C and D are de-powered.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit package comprising:
   a die comprising:
      a first substrate implementing an integrated circuit comprising circuit elements at a surface of the first substrate;
      a first plurality of metal layers disposed at the surface of the first substrate, the first plurality of metal layers implementing a first portion of a metal interconnect structure for the integrated circuit; and
      a first plurality of pads at or overlying a top metal layer of the first plurality of metal layers;
      wherein the first portion of the metal interconnect structure comprises a first metal interconnect path coupled between a first circuit block of the integrated circuit and a first pad of the first plurality of pads and comprises a second metal interconnect path coupled between a second circuit block of the integrated circuit and a second pad of the plurality of pads, wherein the second metal interconnect path does not connect to the first metal interconnect path within the first plurality of metal layers; and
   an interposer comprising:
      a second plurality of metal layers disposed at a first surface of the interposer, the second plurality of metal layers implementing a second portion of the metal interconnect structure; and
      a second plurality of pads at or overlying a top metal layer of the second plurality of metal layers;
      wherein the second portion of the metal interconnect structure comprises a third metal interconnect path coupled between a third pad of the second plurality of pads and a fourth pad of the second plurality of pads; and
   a first plurality of solder structures coupling the first plurality of pads and the second plurality of pads, the first plurality of solder structures comprising a first solder structure coupling the first pad and the third pad and a second solder structure coupling the second pad and the fourth pad.

2. The integrated circuit package of claim 1, further comprising:
   a second plurality of pads disposed at a second surface of the interposer.

3. The integrated circuit package of claim 2, further comprising:
   a plurality of through-substrate vias extending from the second surface of the interposer to the second plurality of metal layers, the second surface opposite the first surface.

4. The integrated circuit package of claim 3, wherein:
   a component of the integrated circuit is identified as inoperative;
   a subset of the through-substrate vias of the plurality of through-substrate vias are configured to provide supply voltages from an external source; and the second portion of the metal interconnect structure is configured to electrically isolate the component of the integrated circuit from the subset of the through-substrate vias.

5. The integrated circuit package of claim 1, wherein the second portion of the metal interconnect structure is configured to electrically isolate conductive features of the first portion of the metal interconnect structure that are connected to a component of the integrated circuit.

6. A method of fabricating an integrated circuit package comprising:
fabricating a die comprising a first substrate implementing an integrated circuit comprising circuit elements at a surface of the first substrate, a first plurality of metal layers disposed at the surface of the first substrate, the first plurality of metal layers implementing a first portion of a metal interconnect structure for the integrated circuit, and a first plurality of pads at or overlying a top metal layer of the first plurality of metal layers, wherein the first portion of the metal interconnect structure comprises a first metal interconnect path coupled to a first circuit block of the integrated circuit and a second metal interconnect path coupled to a second circuit block of the integrated circuit;
fabricating an interposer comprising a second plurality of metal layers disposed at a first surface of the interposer, the second plurality of metal layers implementing a second portion of the metal interconnect structure, and a second plurality of pads at or overlying a top metal layer of the second plurality of metal layers, wherein the second portion of the metal interconnect structure comprises a third metal interconnect path; and
bonding the die and interposer via the first plurality of pads and the second plurality of pads, wherein bonding the die and interposer couples the first, second, and third metal interconnect paths together to form a signal path between the first circuit block and the second circuit block.

7. The method of claim 6, wherein fabricating the interposer comprises:
forming a plurality of through-substrate vias extending from a second surface of the interposer to the second plurality of metal layers, the second surface opposite the first surface.

8. The method of claim 7, wherein fabricating the interposer further comprises:
forming a plurality of package leads at the second surface of the interposer, each package lead coupled to a corresponding through-substrate via of the plurality of through-substrate vias.

9. The method of claim 7, further comprising:
identifying a component of the integrated circuit as inoperative; and
wherein fabricating the interposer comprises fabricating the second plurality of metal layers so as to isolate conductive features of the first plurality of metal layers that are connected to the component from those through-substrate vias that are configured to couple to supply voltages.

10. The method of claim 9, wherein identifying the component as inoperative comprises:
probe testing the integrated circuit via the first plurality of pads; and
identifying the component as inoperative based on the probe testing.

11. The method of claim 6, wherein fabricating the interposer further comprises:
forming a plurality of package leads; and
forming a plurality of wirebond leads coupled between the package leads and corresponding wirebond pads at a second surface of the interposer.

12. The method of claim 6, further comprising:
identifying a component of the integrated circuit as inoperative; and
wherein fabricating the interposer comprises fabricating the second plurality of metal layers so as to isolate the component from supply voltages.

13. The method of claim 12, wherein identifying the component as inoperative comprises:
probe testing the integrated circuit via the first plurality of pads; and
identifying the component as inoperative based on the probe testing.

14. A method of fabricating an integrated circuit package, the method comprising:
fabricating a die comprising a first substrate implementing an integrated circuit comprising circuit elements at a surface of the first substrate, a first plurality of metal layers disposed at the surface of the first substrate, the first plurality of metal layers implementing a first portion of a metal interconnect structure for the integrated circuit, and a first plurality of pads at or overlying a top metal layer of the first plurality of metal layers;
probe testing the integrated circuit via the first plurality of pads to determine an operational status of a set of components of the integrated circuit;
selecting an interposer from a plurality of available interposers based on the operational status, the selected interposer comprising a second plurality of metal layers implementing a second portion of the metal interconnect structure, the second plurality of metal layers comprising a second top metal layer comprising a second plurality of pads at a first surface of the interposer; and
bonding the die to the interposer via solder structures joining the first plurality of pads to the second plurality of pads.

15. The method of claim 14, wherein selecting the interposer comprises:
selecting as the interposer a first interposer responsive to the operational status indicating a first component of the integrated circuit is operative, the first interposer comprising the second plurality of metal layers configuring the second portion of the metal interconnect structure so as to electrically couple the first component to at least one supply voltage.

16. The method of claim 15, wherein selecting the interposer further comprises:
selecting as the interposer a second interposer responsive to the operational status indicating the first component of the integrated circuit is inoperative, the second interposer comprising the second plurality of metal layers configuring the second portion of the metal interconnect structure so as to electrically isolate the first component from the at least one supply voltage.

17. The method of claim 14, wherein selecting the interposer comprises:
selecting as the interposer a first interposer responsive to the operational status indicating a first component of the integrated circuit is inoperative, the first interposer comprising the second plurality of metal layers configuring the second portion of the metal interconnect structure so as to electrically isolate the first component from at least one supply voltage.

18. The method of claim 14, wherein fabricating the interposer comprises:
   forming a plurality of through-substrate vias extending from a second surface of the interposer to the second plurality of metal layers, the second surface opposite the first surface.

19. The method of claim 18, wherein fabricating the interposer further comprises:
   forming a plurality of package leads at the second surface of the interposer, each package lead coupled to a corresponding through-substrate via of the plurality of through-substrate vias.

20. The method of claim 19, wherein the package leads comprise solder structures.

* * * * *